(12) United States Patent
Nomura

(10) Patent No.: US 12,245,363 B2
(45) Date of Patent: Mar. 4, 2025

(54) ELECTRONIC COMPONENT MODULE, AND METHOD OF MANUFACTURING THE SAME

(71) Applicant: Murata Manufacturing Co., Ltd., Nagaokakyo (JP)

(72) Inventor: Tadashi Nomura, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 189 days.

(21) Appl. No.: 18/185,660

(22) Filed: Mar. 17, 2023

(65) Prior Publication Data

US 2023/0232527 A1 Jul. 20, 2023

Related U.S. Application Data

(63) Continuation of application No. PCT/JP2021/034409, filed on Sep. 17, 2021.

(30) Foreign Application Priority Data

Sep. 28, 2020 (JP) .................. 2020-162455

(51) Int. Cl.
*H05K 1/02* (2006.01)
*H05K 1/18* (2006.01)
*H05K 3/28* (2006.01)

(52) U.S. Cl.
CPC .......... *H05K 1/0218* (2013.01); *H05K 1/181* (2013.01); *H05K 1/186* (2013.01); *H05K 3/28* (2013.01); *H05K 2201/10098* (2013.01); *H05K 2201/10189* (2013.01); *H05K 2203/0271* (2013.01); *H05K 2203/308* (2013.01)

(58) Field of Classification Search
CPC .................................................. H05K 1/0218
See application file for complete search history.

(56) References Cited

U.S. PATENT DOCUMENTS

2016/0120039 A1 4/2016 Bang et al.
2018/0134546 A1 5/2018 Oh et al.
(Continued)

FOREIGN PATENT DOCUMENTS

JP 2003-133777 A 5/2003
JP 2019-212870 A 12/2019

OTHER PUBLICATIONS

International Search Report for PCT/JP2021/034409 dated Dec. 7, 2021.

*Primary Examiner* — Sherman Ng
(74) *Attorney, Agent, or Firm* — McDonald Hopkins LLC

(57) ABSTRACT

A cap including a side wall portion having conductivity, a lid portion, a thin portion formed at least around the lid portion, and a beam portion supporting the lid portion is formed, an exposed component and a sealing component are mounted on a module substrate, the cap is mounted on the module substrate so as to surround an exposed component, the sealing component and the cap are sealed with a sealing resin, the lid portion is ground so as to reduce its thickness until the thin portion disappears, a shield layer is formed on an outer surface of the sealing resin and a side surface of the module substrate, a translucent adhesive sheet is attached on a top surface of the sealing resin, the beam portion is cut by laser through the adhesive sheet, and the adhesive sheet is peeled together with a lid portion.

7 Claims, 17 Drawing Sheets

(56) References Cited

U.S. PATENT DOCUMENTS

| | | | |
|---|---|---|---|
| 2019/0215993 A1* | 7/2019 | Yagi | H01L 23/04 |
| 2019/0274212 A1* | 9/2019 | Otsubo | H05K 1/0216 |
| 2019/0310687 A1* | 10/2019 | Hong | H01L 23/66 |
| 2019/0378802 A1 | 12/2019 | Ito | |
| 2020/0075502 A1 | 3/2020 | Kim et al. | |
| 2020/0323077 A1* | 10/2020 | Han | H05K 3/4007 |
| 2021/0051797 A1* | 2/2021 | Han | H05K 1/147 |

* cited by examiner

[CAP FORMING STEP]

[COMPONENT MOUNTING STEP]

[CAP MOUNTING STEP]

[RESIN SEALING STEP]

[GRINDING STEP]

[SHIELD LAYER FORMING STEP]

[ADHESIVE SHEET ATTACHING STEP]

[LASER PROCESSING STEP]

[CAP FORMING STEP]

[COMPONENT MOUNTING STEP]

[CAP MOUNTING STEP]

[RESIN SEALING STEP]

[GRINDING STEP]

[SHIELD LAYER FORMING STEP]

[ADHESIVE SHEET ATTACHING STEP]

[LASER PROCESSING STEP]

Prior Art

ELECTRONIC COMPONENT MODULE, AND METHOD OF MANUFACTURING THE SAME

CROSS REFERENCE TO RELATED APPLICATION

This is a continuation of International Application No. PCT/JP2021/034409 filed on Sep. 17, 2021 which claims priority from Japanese Patent Application No. 2020-162455 filed on Sep. 28, 2020. The contents of these applications are incorporated herein by reference in their entireties.

BACKGROUND OF THE DISCLOSURE

Field of the Disclosure

The present disclosure relates to an electronic component module including a module substrate and an electronic component mounted on the module substrate, and a method of manufacturing such an electronic component module.

Description of the Related Art

Patent Literature 1 discloses an electronic component module including a sealing component that is sealed with a resin and an exposed component that is not sealed with a resin. The electronic component module includes a module substrate, a component, a sealing resin, and a shield layer. The component is mounted on the module substrate, and the sealing resin seals the component on the module substrate. The shield layer is formed on a surface of the sealing resin.

In a method of manufacturing an electronic component module disclosed in Patent Literature 1, a metal cap covers the exposed component so that the exposed component may not be sealed with the sealing resin, and the whole cap is sealed with a resin to form a shield layer on the surface of the sealing resin. Subsequently, the cap is ground, so that the exposed component is exposed. A side wall portion of the cap is electrically connected to the shield layer, and functions as a shield member.

Patent Literature 1

U.S. Unexamined Patent Application Publication No. 2019/0310687

BRIEF SUMMARY OF THE DISCLOSURE

Herein, a problem that occurs in a manufacturing process of the electronic component module disclosed in Patent Literature 1 will be described with reference to FIG. 17A and FIG. 17B. FIG. 17A is a cross-sectional view when a pressure during grinding is applied to a lid portion 12 of the cap. In addition, FIG. 17B is a cross-sectional view in a state in which the lid portion 12 of the cap is separated and enters the cap.

The method of manufacturing an electronic component module disclosed in Patent Literature 1 has problems to be described below.

First, as shown in FIG. 17A and FIG. 17B, the lid portion 12 of the cap is pressed into the cap without being completely cut by a pressure of a grinding tool, and the lid portion may remain in the cap after grinding. A burr RP is generated in a side wall portion 11 of the cap by the grinding, so that the lid portion 12 is caught in the burr RP and cannot be removed easily.

In addition, a large amount of grinding dust is entered into the cap, and the grinding dust that has not been able to be removed may cause malfunction of the exposed component 20.

In view of the foregoing, exemplary embodiments of the present disclosure are directed to provide an electronic component module that avoids a problem that occurs while a cap that covers an exposed component is processed.

A method of manufacturing an electronic component module as an exemplary embodiment of the present disclosure includes a cap forming step of forming a cap that includes a side wall portion, a lid portion, a thin portion formed at least around the lid portion, and a beam portion supporting the lid portion, a component mounting step of mounting an exposed component and an unexposed component on a module substrate, a cap mounting step of mounting the cap on the module substrate so as to surround the exposed component, a grinding step of grinding the lid portion so as to reduce a thickness of the lid portion of the cap until the thin portion disappears, an adhesive sheet attaching step of attaching a translucent adhesive sheet on a top surface of the lid portion, a beam portion cutting step of cutting the beam portion through the adhesive sheet, and a lid portion peeling step of peeling the adhesive sheet together with the lid portion.

According to such a manufacturing method, since the beam portion holds the lid portion during the grinding, the lid portion is not pressed inside the cap by a grinding pressure. Therefore, the lid portion is able to be prevented from being left inside the cap after the grinding. In addition, the grinding is able to be performed while the lid portion remains, so that grinding dust does not easily enter the cap, and malfunction of the exposed component due to the grinding dust is able to be reduced. Further, the entire periphery of a top surface of the cap is electrically connected to the shield layer, so that shield property of the exposed component is maintained.

An electronic component module as an exemplary embodiment of the present disclosure includes a module substrate that includes a ground electrode layer, an exposed component and a sealing component that are mounted on at least one surface of the module substrate, a sealing resin that covers at least the one surface of the module substrate and the sealing component, a shield layer that is formed on a top surface and a side surface of the sealing resin and a side surface of the module substrate, and is electrically connected to the ground electrode layer, and a side wall portion that surrounds a periphery of the exposed component and has conductivity to electrically connect to the shield layer, and the side wall portion further includes at least one protruding portion that protrudes toward an interior space surrounded by the side wall portion and includes a tip that forms a polygon having a predetermined area, at an upper end portion of the side wall portion.

According to the electronic component module, a shield wall surrounding the periphery of the exposed component is electrically connected to the shield layer, so that the shield property of the exposed component is maintained.

According to the present disclosure, an electronic component module that avoids a problem that occurs while a cap that covers an exposed component is processed is able to be obtained.

DETAILED DESCRIPTION OF THE DISCLOSURE

Figure 1A:
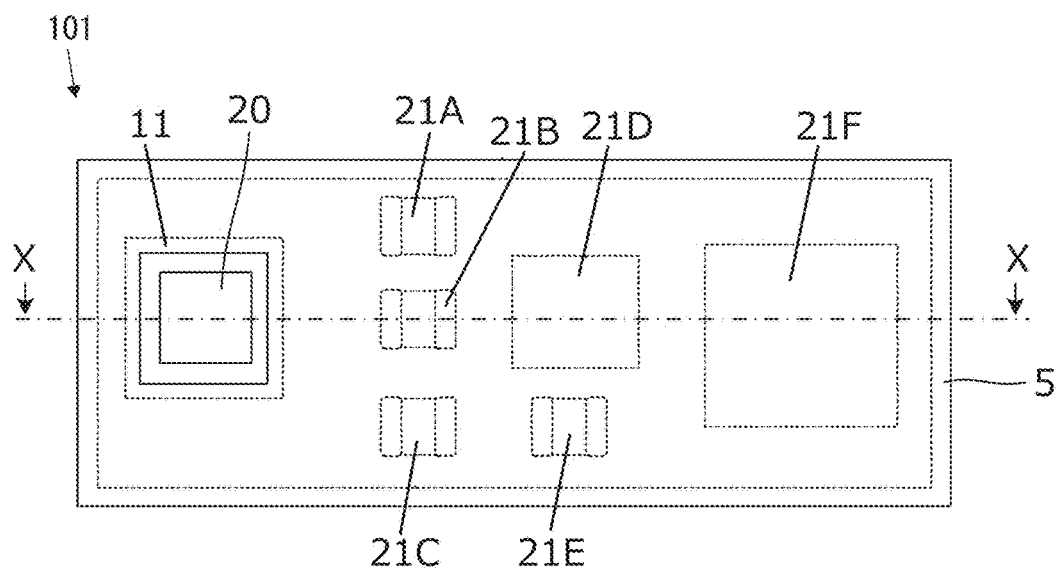
FIG. 1A is a bottom view of an electronic component module according to a first exemplary embodiment.

Hereinafter, a plurality of exemplary embodiments of the present disclosure will be described with reference to the attached drawings and several specific examples. In the drawings, components and elements assigned with the same reference numerals or symbols will represent identical or substantially identical components and elements. While the plurality of exemplary embodiments of the present disclosure are divided into a group of exemplary embodiments and described for the sake of convenience in consideration of ease of description or understanding of main points, constituent elements described in different exemplary embodiments are able to be partially replaced and combined with each other. In the second and subsequent exemplary embodiments, a description of matters common to the first exemplary embodiment will be omitted and only different points will be described. In particular, the same advantageous functions and effects by the same configurations will not be described one by one for each exemplary embodiment.

First Exemplary Embodiment

Figure 1B:
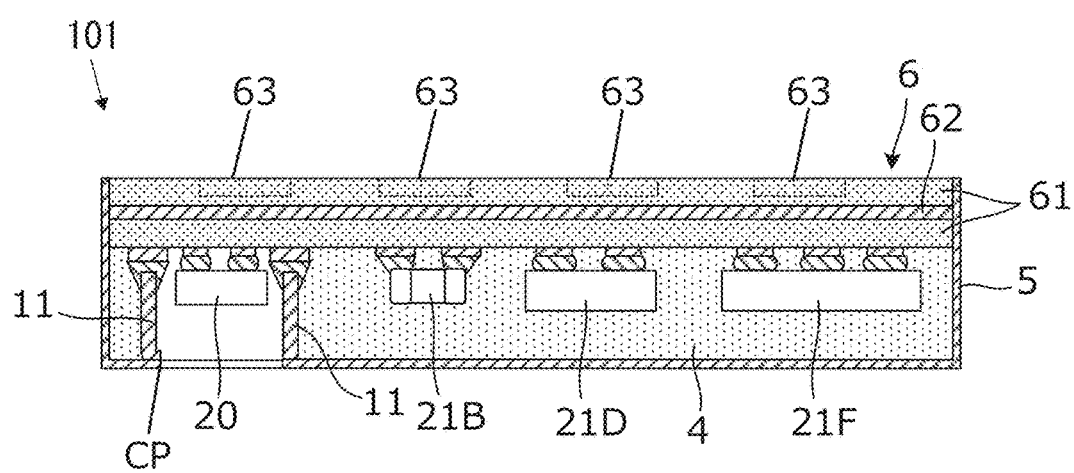
FIG. 1B is a cross-sectional view of an X-X portion in FIG. 1A.

FIG. 1A is a bottom view of an electronic component module according to a first exemplary embodiment, and FIG. 1B is a cross-sectional view of an X-X portion in FIG. 1A.

The electronic component module 101 includes a module substrate 6, an exposed component 20, sealing components 21A to 21F, a sealing resin 4, a shield layer 5, and a side wall portion 11. The module substrate 6 includes a base material layer 61, and an electrode of a ground electrode layer 62 and the like that are formed on the base material layer 61. The exposed component 20 and the sealing components 21A to 21F are mounted on at least a first surface (a bottom surface in an example shown in FIG. 1B) of the module substrate 6.

The side wall portion 11 has conductivity. In a plan view of the module substrate 6, the side wall portion 11 is a substantially rectangular frame body and has a predetermined height. In the plan view of the module substrate 6, the side wall portion 11 surrounds the exposed component 20. In other words, the exposed component 20 is placed in a space surrounded by the side wall portion 11.

The side wall portion 11 includes a protruding portion PP at an upper end. The protruding portion PP has a shape that protrudes from an inner wall surface of the side wall portion 11 into a space surrounded by the side wall portion 11. The protruding portion PP has a substantially rectangular tip surface having a predetermined area. The tip surface configures a part of a cut surface CP to be described below.

The sealing resin 4 covers at least the first surface and the sealing components 21A to 21F of the module substrate 6. In other words, the sealing resin 4 is placed on a first main surface side of the module substrate 6, except for the space surrounded by the side wall portion 11.

The shield layer 5 is formed on a top surface (a bottom surface in the direction of FIG. 1B) and a side surface of the sealing resin 4, and a side surface of the module substrate 6. The shield layer 5 is electrically connected to the ground electrode layer 62.

Further, the shield layer 5 is formed so as to expose the space surrounded by the side wall portion 11 to outside. In such a case, the shield layer 5 is formed so as to overlap (cover an outer surface of the protruding portion PP) with the protruding portion PP of the side wall portion 11. As a result, an area of connection between the side wall portion 11 and the shield layer 5 is able to be kept large, the reliability of connection between the side wall portion 11 and the shield layer 5 is improved, and the ground of the side wall portion 11 is further stabilized.

An antenna conductor pattern 63 is formed on a second surface of the module substrate 6. The antenna conductor pattern configures an antenna for millimeter wave bands used by 5G (the fifth-generation mobile communication system), for example.

Several components among the sealing components 21A to 21F are high-frequency circuit components to be connected to the antenna conductor pattern 63. The electronic component module 101 is a high frequency module for millimeter wave bands used by the above 5G, for example, and is mounted on a smartphone, for example.

Figure 2:
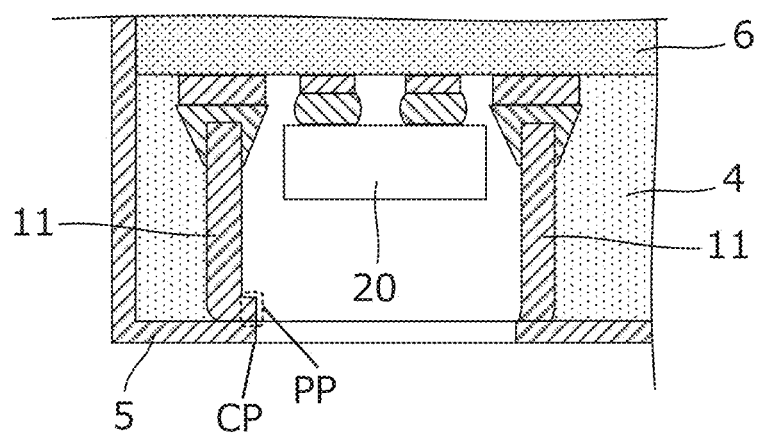
FIG. 2 is an enlarged view of a vicinity of an exposed component 20 in FIG. 1B.

FIG. 2 is an enlarged view of a vicinity of the exposed component 20 in FIG. 1B. The exposed component 20 is a connector, for example, and is connected to a high-frequency circuit in the electronic component module 101. The connector connects the electronic component module 101 to an external circuit, and sends and receives a signal between the electronic component module 101 and the external circuit. The connector may have a multi-terminal structure.

The side wall portion 11 surrounding a periphery of the exposed component 20 is electrically connected to the shield layer 5 formed on a surface of the sealing resin 4, and the shield layer 5 is electrically connected to the ground electrode layer 62 formed on the module substrate 6. Therefore, the components except for the exposed component 20 are electromagnetically shielded by the side wall portion 11, the shield layer 5, and the ground electrode layer 62.

The shield layer 5 may be a metal film formed by sputtering, plating, or the like, and may be configured by stacking a plurality of layers made of a plurality of types of metals. The shield layer 5 has a three-layered structure of a cohesive layer, a conductive layer, and a rust-prevention layer, for example, sequentially from the sealing resin 4. The function and characteristics of each layer are as follows.

[Cohesive Layer]

The shield layer 5 is closely contacted to the sealing resin 4.

A thickness of the cohesive layer is smaller than a thickness of the conductive layer. For example, Ti, Cr, stainless steel (SUS), or the like is able to be used.

[Conductive Layer]

Electromagnetic interference waves are shielded.

A metal having high electrical conductivity makes configuration, and the thickness is larger than the thickness of the cohesive layer and the rust-prevention layer (shield performance is determined by the conductive layer). For example, copper (Cu), silver (Ag), aluminum (Al), or the like is able to be used.

[Rust-Prevention Layer]

Oxidation or corrosion of the conductive layer is prevented.

The thickness of the rust-prevention layer has several hundreds of nm to several μm, and is smaller than the thickness of the conductive layer. For example, Ti, Cr, stainless steel (SUS), or the like is able to be used.

Subsequently, the method of manufacturing the electronic component module 101 will be described with reference to each drawing for each step.

[Cap Forming Step]

A cap forming step forms a cap including a side wall portion 11 having conductivity, a lid portion 12, a thin portion 13 formed in a periphery of the lid portion 12, and a beam portion 14 supporting the lid portion 12 is formed.

Figure 3A:
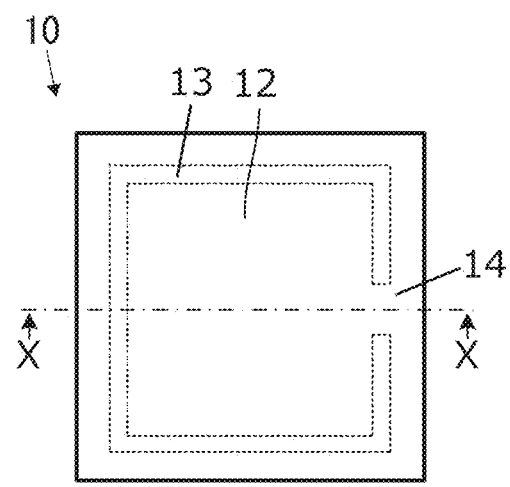
FIG. 3A is a plan view of a cap 10 to be mounted on a module substrate 6.
Figure 3B:
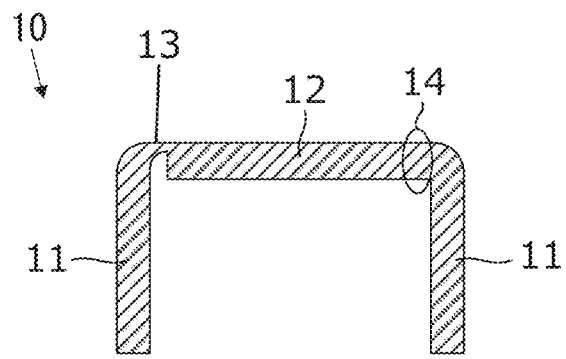
FIG. 3B is a cross-sectional view of an X-X portion in FIG. 3A.

FIG. 3A is a plan view of a cap 10 to be mounted on a module substrate 6, and FIG. 3B is a cross-sectional view of an X-X portion in FIG. 3A.

The cap 10 is a molded body by press working of a copper plate, for example. In the example, the thin portion 13 is formed around the lid portion 12 except for one part, and the one part is formed as the beam portion 14. The cap 10 may be configured by a single material or may be configured by a metal film such as copper on a surface of a resin molded body such as an epoxy resin, for example.

[Component Mounting Step]

Figure 4A:
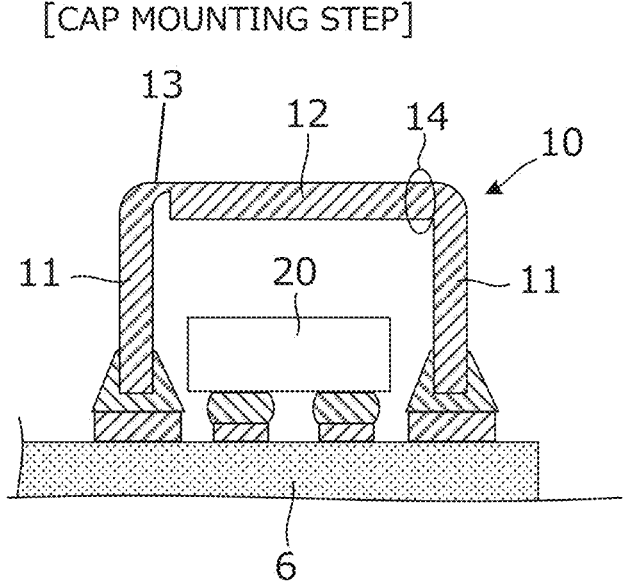
FIG. 4A is a cross-sectional view of a vicinity of the cap 10 mounted on the module substrate 6.

A component mounting step mounts the exposed component 20 and the sealing components 21A to 21F on the module substrate 6. FIG. 4A is a cross-sectional view of a vicinity of the cap 10 mounted on the module substrate 6.

The exposed component 20 is a bump component that includes a solder bump, and, as shown in FIG. 4A, is mounted on the module substrate 6 through the solder bump. In the example shown in FIG. 1A and FIG. 1B, the sealing components 21A, 21B, 21C, and 21E are chip components that have a terminal on both ends, and the sealing components 21D and 21F are bump components that have a solder bump. These sealing components 21A to 21F are mounted on the module substrate 6.

[Cap Mounting Step]

As shown in FIG. 4A, the cap 10 is mounted on the module substrate 6 so as to cover the exposed component 20.

[Resin Sealing Step]

Figure 4B:
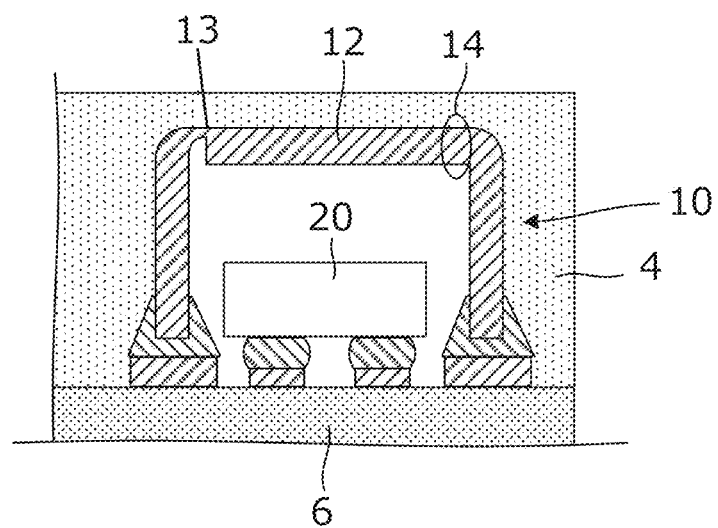
FIG. 4B is a cross-sectional view of the vicinity of the cap 10 after being sealed with a resin.

FIG. 4B is a cross-sectional view of the vicinity of the cap 10 after being sealed with a resin. In such a manner, the sealing components 21A to 21F and the cap 10 on the module substrate 6 are sealed with the sealing resin 4. The sealing resin 4 is an epoxy resin, for example, and covers by a method such as compression molding or dispenser application.

[Grinding Step]

Figure 5A:
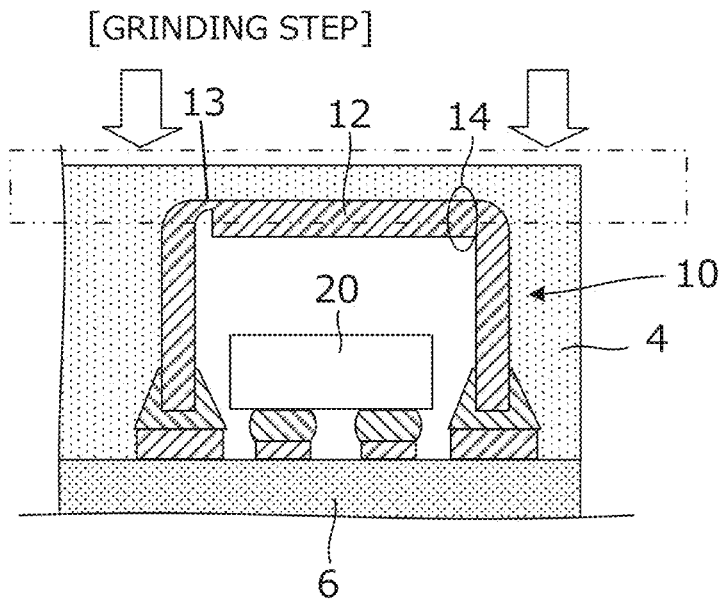
FIG. 5A is a cross-sectional view of the vicinity of the cap 10 in a grinding step.
Figure 5B:
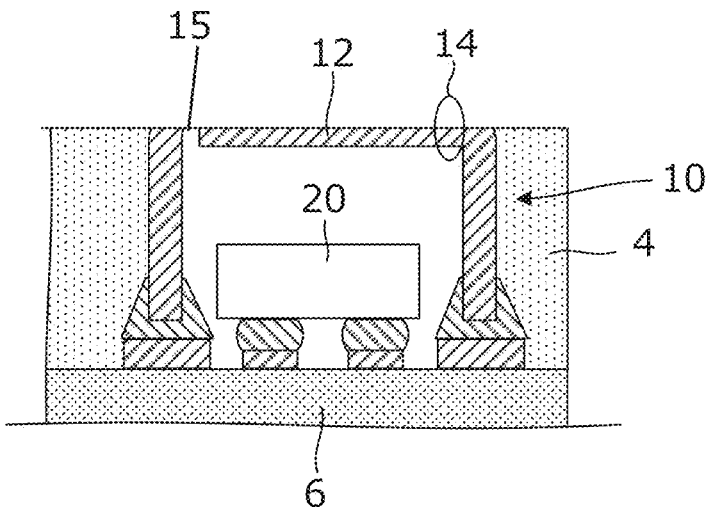
FIG. 5B is a cross-sectional view in a state in which a thin portion 13 disappears.
Figure 5C:
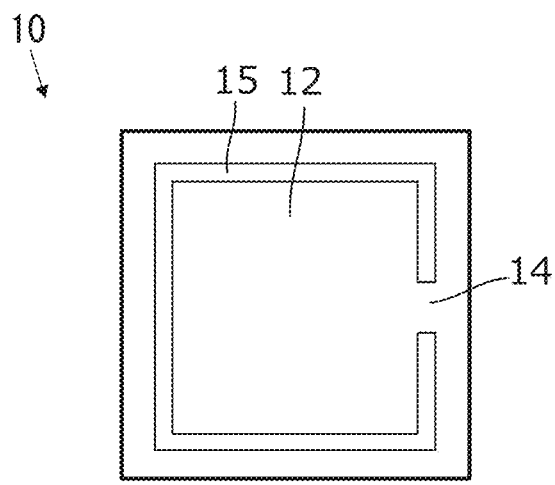
FIG. 5C is a plan view of FIG. 5B.

FIG. 5A is a cross-sectional view of the vicinity of the cap 10 in a grinding step. As shown in FIG. 5A, the grinding step grinds the lid portion 12 so as to reduce the thickness of the lid portion 12 of the cap 10 until the thin portion 13 disappears. FIG. 5B is a cross-sectional view in a state in which the thin portion 13 disappears and a space 15 is formed, and FIG. 5C is a plan view of FIG. 5B. In the state in which the thin portion 13 disappears, the lid portion 12 of the cap 10 is supported by only the beam portion 14.

[Shield Layer Forming Step]

Figure 6:
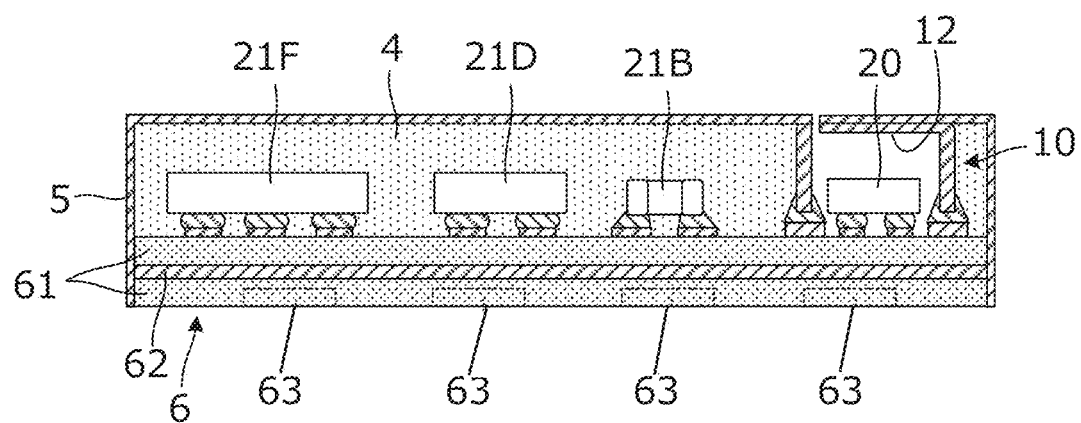
FIG. 6 is a cross-sectional view of a plane passing through the cap 10, in a shield layer forming step.
Figure 7A:
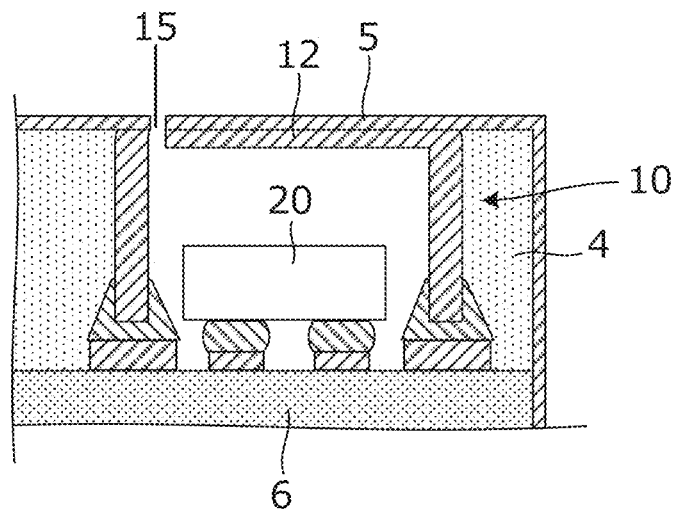
FIG. 7A is a cross-sectional view of the vicinity of the cap 10.

FIG. 6 is a cross-sectional view of a plane passing through the cap 10, in a shield layer forming step. FIG. 7A is a cross-sectional view of the vicinity of the cap 10. The shield layer forming step forms the shield layer 5 on the outer surface of the sealing resin 4, the surface of the lid portion 12, and the side surface of the module substrate 6.

[Adhesive Sheet Attaching Step]

Figure 7B:
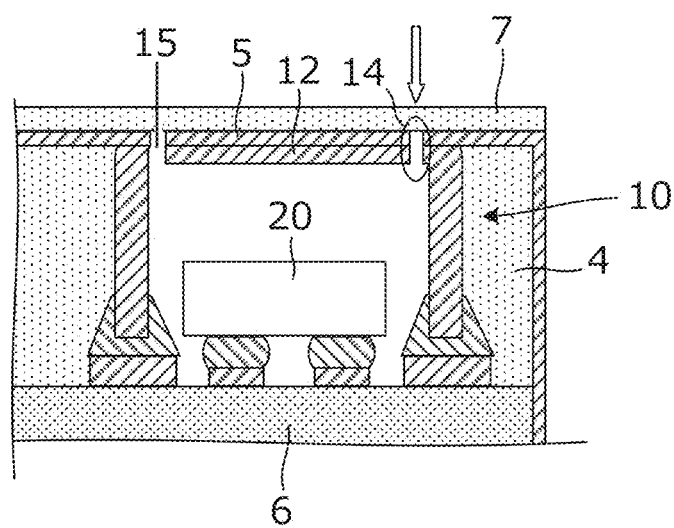
FIG. 7B is a cross-sectional view of the plane passing through the cap 10, in an adhesive sheet attaching step.

FIG. 7B is a cross-sectional view of the plane passing through the cap 10, in an adhesive sheet attaching step. The adhesive sheet attaching step attaches a translucent adhesive sheet 7 to the top surface of the lid portion 12. The base material of the adhesive sheet 7 is a sheet such as an acrylic resin or a polyimide resin, for example, and an adhesive layer is an acrylic resin or polyvinyl alcohol, for example.

[Beam Portion Cutting Step]

A beam portion cutting step cuts the beam portion 14 through the adhesive sheet 7 by laser processing, blade processing, or the like. In such a case, the beam portion 14 is cut at a position spaced by a predetermined distance closer to an interior space of the cap 10 than to an inner wall surface of the side wall portion 11 of the cap 10. As a result, a remaining portion of the beam portion 14 connected to the side wall portion 11 serves as the protruding portion PP. Then, a cut beam portion 14 (the protruding portion PP) and the tip surface of the shield layer 5 serve as the cut surface CP shown in FIG. 1B.

[Lid Portion Peeling Step]

Figure 8:
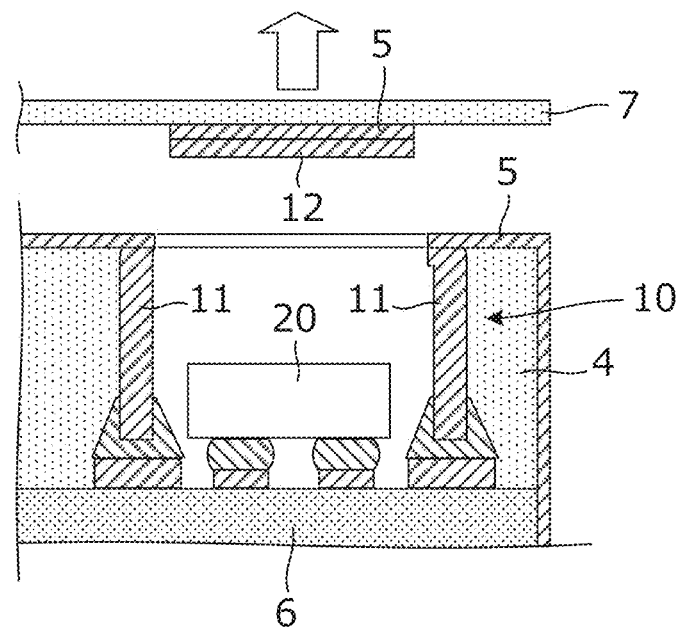
FIG. 8 is a cross-sectional view of the plane passing through the cap 10, in a lid portion peeling step.

FIG. 8 is a cross-sectional view of the plane passing through the cap 10, in a lid portion peeling step. The lid portion peeling step peels the adhesive sheet 7 together with the lid portion 12 and the shield layer 5.

According to the above steps, the electronic component module 101 is manufactured. Although each drawing shown above shows an electronic component module as a single unit, a plurality of electronic component modules may be manufactured on a mother board, and lastly may be divided into an individual piece of a unit of an electronic component module.

According to the present exemplary embodiment, the following functional and advantageous effects are obtained.

(1) The beam portion 14 supports the lid portion 12 during grinding, so that the lid portion 12 is not pressed inside the cap 10 by a grinding pressure. Therefore, the lid portion 12 is able to be prevented from being left inside the cap 10 after the grinding.

(2) The grinding is able to be performed while the lid portion 12 remains, so that grinding dust does not easily enter the cap 10, and malfunction of the exposed component 20 due to the grinding dust is able to be reduced.

(3) The entire periphery of the top surface of the cap 10 is electrically connected to the shield layer 5, so that shield property of the exposed component 20 is maintained.

It is to be noted that, although the example shown above provides an example in which the lid portion 12 has a square shape, the shape of the lid portions 12 may be a rectangle, a polygon, a circle, an oval, an ellipse, or the like.

Second Exemplary Embodiment

In a second exemplary embodiment, an electronic component module different in the structure of the beam portion and the shape of the lid portion from the example shown in the first exemplary embodiment will be described.

Figure 9A:
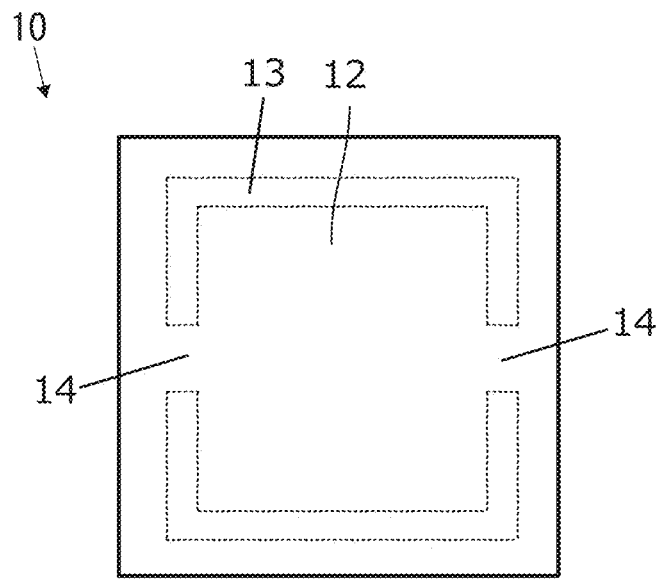
FIG. 9A and FIG. 9B are plan views of a cap 10 included in an electronic component module according to a second exemplary embodiment.
Figure 9B:
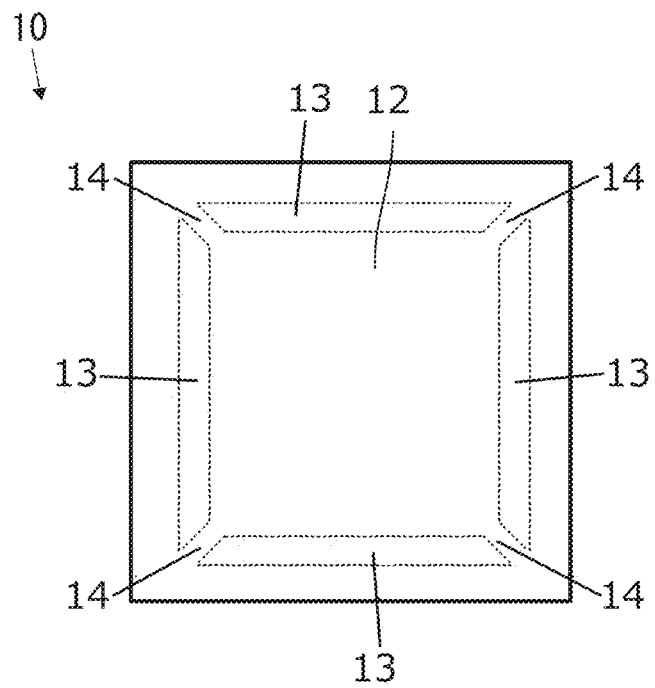

FIG. 9A and FIG. 9B are plan views of a cap 10 included in the electronic component module according to the second exemplary embodiment. In comparison with FIG. 3A shown in the first exemplary embodiment, a difference from the electronic component module 101 according to the first exemplary embodiment is obvious.

In the example of FIG. 9A, the thin portion 13 is formed around the lid portion 12 except for two parts, and the two parts are formed as the beam portion 14. The beam portion 14 is formed in a central portion of facing two sides among four sides that the thin portion 13 forms.

In the example of FIG. 9B, the thin portion 13 is formed around the lid portion 12 except for four parts, and the four parts are formed as the beam portion 14. The beam portion 14 is formed at four corners of four sides that the thin portion 13 forms.

In such a manner, the beam portion 14 that supports the lid portion 12 of the cap 10 may include a plurality of beam portions. In that case, the plurality of beam portions 14 are preferably placed to the center of the lid portion 12 in a symmetrical position. This is because the lid portion 12 is able to be stably supported on both ends.

Figure 10A:
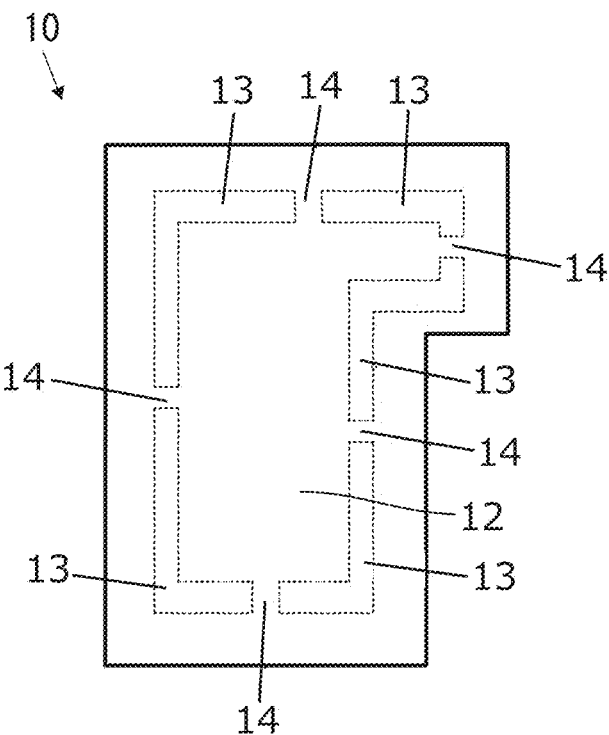
FIG. 10A and FIG. 10B are plan views of another cap 10 further included in the electronic component module according to the second exemplary embodiment.
Figure 10B:
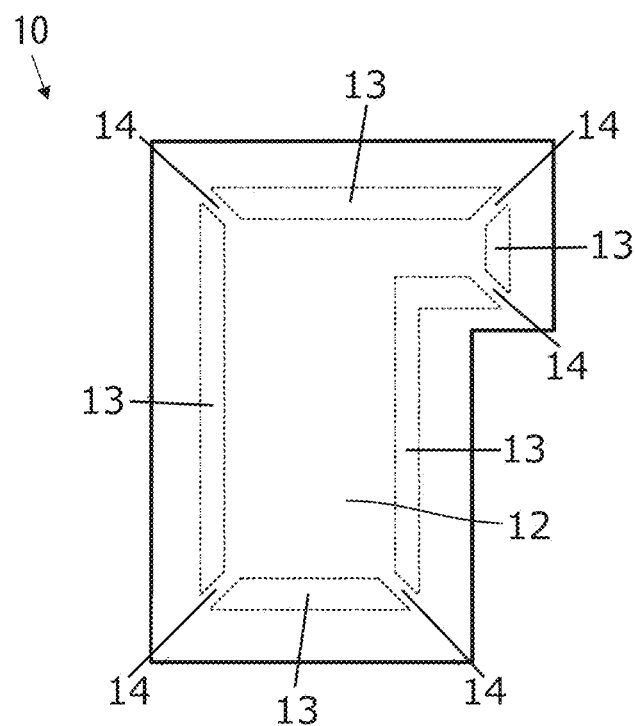

FIG. 10A and FIG. 10B are plan views of another cap 10 further included in the electronic component module according to the second exemplary embodiment.

In the example of FIG. 10A and FIG. 10B, the cap 10 includes a lid portion 12 that has a shape other than a rectangle. In these examples, the lid portion 12 has six sides.

In the example of FIG. 10A, the thin portion 13 is formed around the lid portion 12 except for five parts, and the five parts are formed as the beam portion 14. The beam portion 14 is formed in a central portion of each of five sides among six sides that the thin portion 13 forms.

In the example of FIG. 10B, the thin portion 13 is formed around the lid portion 12 except for five parts, and the five parts are formed as the beam portion 14. The beam portion 14 is formed at five corner portions that the thin portion 13 forms.

Although the example shown in FIG. 10A and FIG. 10B shows the lid portion 12 that has six corner portions in a plan view, the lid portion 12 may include five or more corner portions. In addition, the shape may be a triangle, a circle, an oval, an ellipse, or the like. In such a manner, the lid portion 12 of the cap 10 is not limited in shape to a rectangle.

Third Exemplary Embodiment

In a third exemplary embodiment, an electronic component module and a method of manufacturing the electronic component module that are different in the structure of the thin portion and the beam portion from the example shown in the first exemplary embodiment will be described.

The electronic component module according to the third exemplary embodiment will be described with reference to each drawing for each step.

[Cap Forming Step]

Figure 11A:
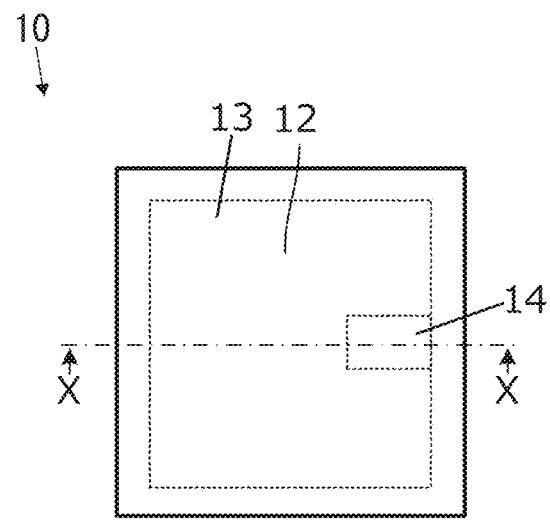
FIG. 11A is a plan view of a cap 10 included in an electronic component module according to a third exemplary embodiment.
Figure 11B:
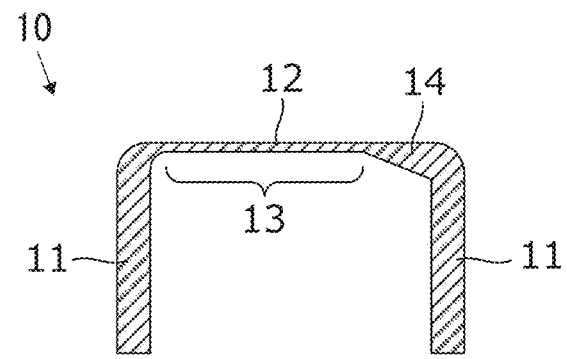
FIG. 11B is a cross-sectional view of an X-X portion in FIG. 11A.

FIG. 11A is a plan view of a cap 10 included in an electronic component module according to the third exemplary embodiment, and FIG. 11B is a cross-sectional view of an X-X portion in FIG. 11A.

The cap 10 is a molded body by press working of a copper plate, for example. In the example, the beam portion 14 is formed in one part around the lid portion 12, and a region except for the beam portion 14 is formed as the thin portion 13. In short, the thin portion 13 extends in a planar manner over a wide area of the lid portion 12.

[Component Mounting Step]

Figure 12A:
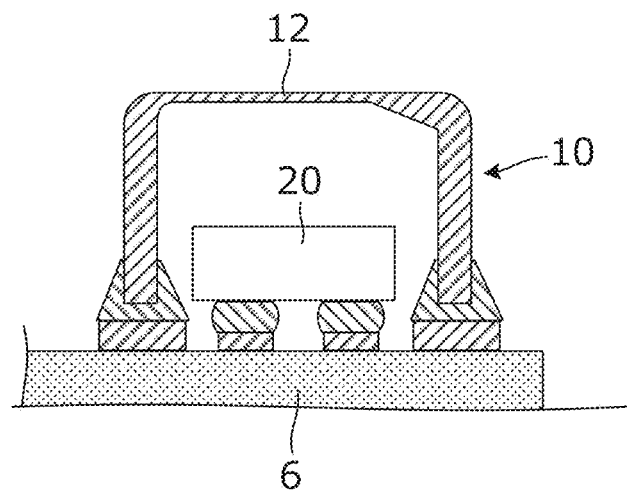
FIG. 12A is a cross-sectional view of the vicinity of the cap 10 mounted on the module substrate 6.

A component mounting step mounts the exposed component 20 and the sealing components 21A to 21F (see FIG. 1A and FIG. 1B) on the module substrate 6. FIG. 12A is a cross-sectional view of the vicinity of the cap 10 mounted on the module substrate 6.

[Cap Mounting Step]

As shown in FIG. 12A, the cap 10 is mounted on the module substrate 6 so as to cover the exposed component 20.

[Resin Sealing Step]

Figure 12B:
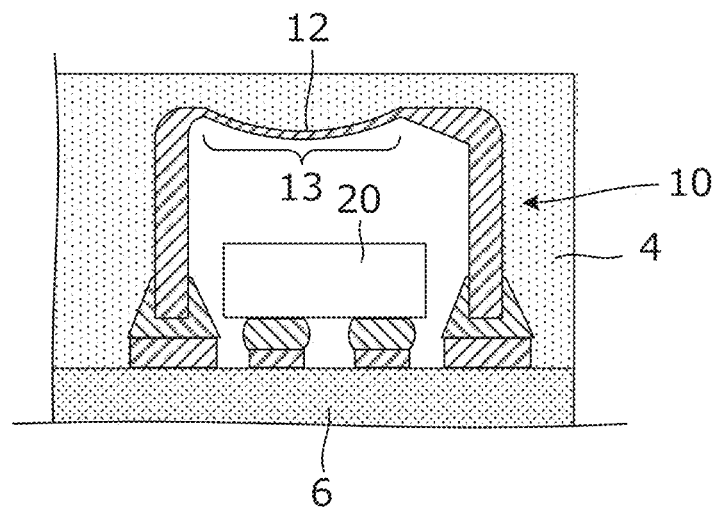
FIG. 12B is a cross-sectional view of the vicinity of the cap 10 after being sealed with a resin.

FIG. 12B is a cross-sectional view of the vicinity of the cap 10 after being sealed with a resin. In such a manner, the sealing components 21A to 21F (see FIG. 1A and FIG. 1B) and the cap 10 on the module substrate 6 are sealed with the sealing resin 4. The sealing resin 4 is an epoxy resin, for example, and covers by a method such as compression molding or dispenser application. As shown in FIG. 12B, the use of the compression molding or the like deforms the thin portion 13 with a pressure of the sealing resin 4. In short, a central portion of the lid portion 12 is depressed inward of the cap 10.

[Grinding Step]

Figure 13A:
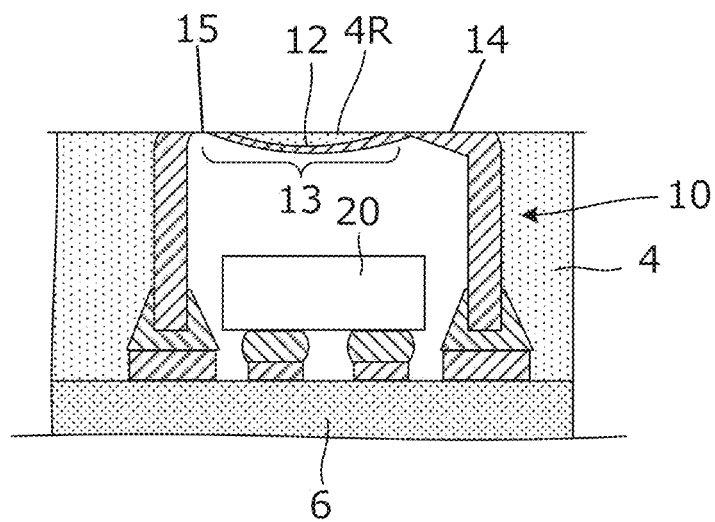
FIG. 13A is a cross-sectional view of the vicinity of the cap 10 in the grinding step.
Figure 13B:
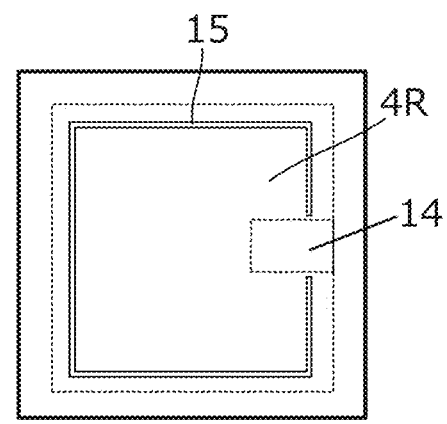
FIG. 13B is a plan view in a state in which a part of the lid portion 12 disappears.

FIG. 13A is a cross-sectional view of the vicinity of the cap 10 in the grinding step. As shown in FIG. 13A, the grinding step grinds the lid portion 12 so as to reduce the thickness of the lid portion 12 of the cap 10 until a part of the lid portion 12 disappears. FIG. 13B is a plan view in a state in which the part of the lid portion 12 disappears. In a state in which the part of the lid portion 12 disappears, the lid portion 12 is supported by only the beam portion 14. A remaining portion 4R of the sealing resin portion is attached to an upper surface of the lid portion 12.

[Shield Layer Forming Step]

Figure 14A:
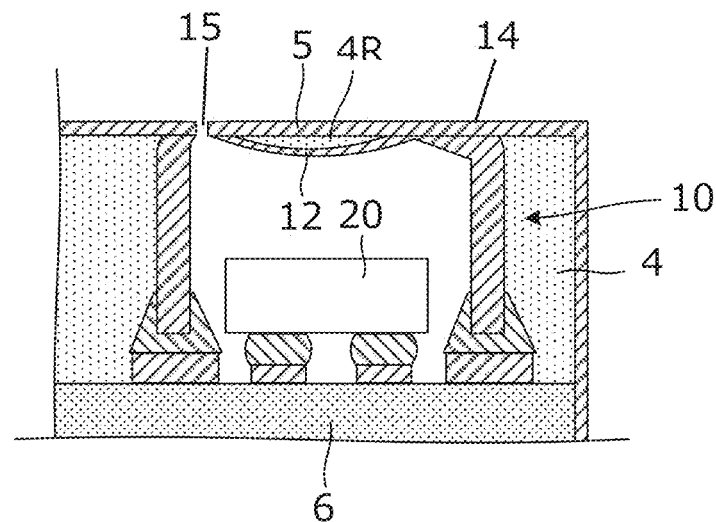
FIG. 14A is a cross-sectional view of the plane passing through the cap 10, in the shield layer forming step.

FIG. 14A is a cross-sectional view of the plane passing through the cap 10, in the shield layer forming step. As with the example described in the first exemplary embodiment, the shield layer forming step forms the shield layer 5 on the outer surface of the sealing resin 4, the surface of the remaining portion 4R of the sealing resin portion attached to the lid portion 12, and the side surface of the module substrate 6.

[Adhesive Sheet Attaching Step]

Figure 14B:
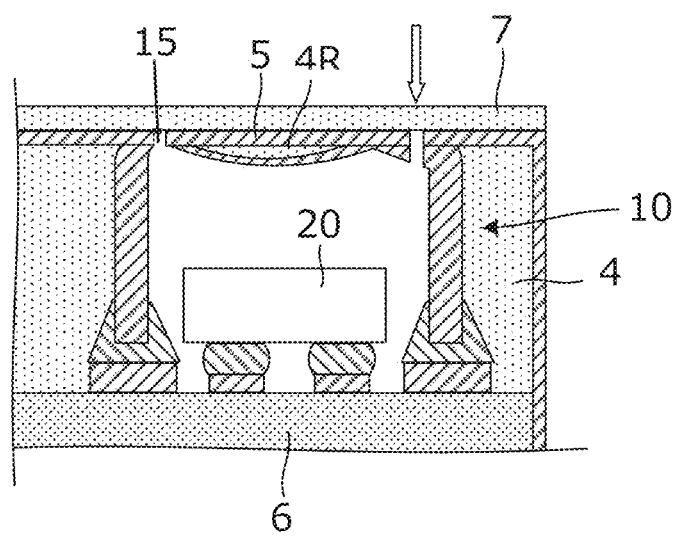
FIG. 14B is a cross-sectional view of the plane passing through the cap 10, in the adhesive sheet attaching step.

FIG. 14B is a cross-sectional view of the plane passing through the cap 10, in the adhesive sheet attaching step. The adhesive sheet attaching step attaches a translucent adhesive sheet 7 to the top surface of the sealing resin 4. The base material of the adhesive sheet 7 is a sheet such as an acrylic resin or a polyimide resin, for example, and an adhesive layer is an acrylic resin or polyvinyl alcohol, for example.

[Laser Processing Step]

The laser processing step cuts with laser the beam portion 14 through the adhesive sheet 7. The beam portion 14 that has been cut in such a manner and a tip of the shield layer 5 correspond to the cut surface CP shown in FIG. 1B.

[Lid Portion Peeling Step]

Figure 15:
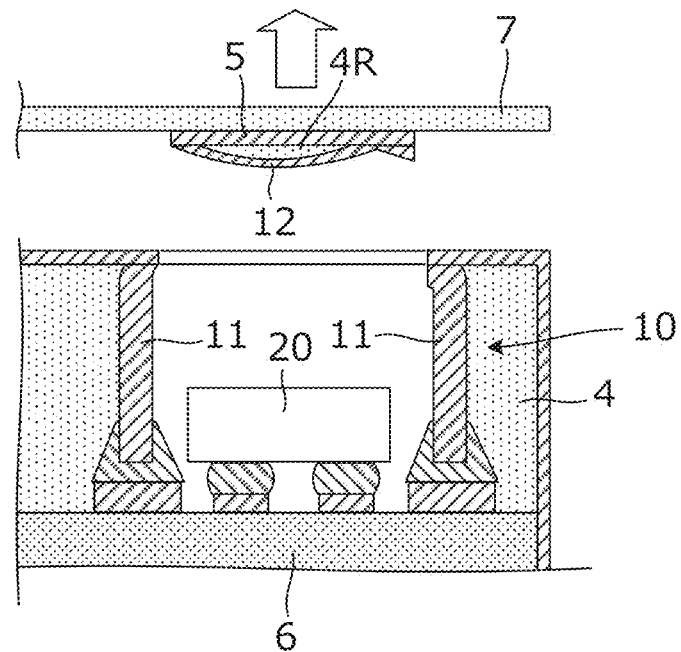
FIG. 15 is a cross-sectional view of the plane passing through the cap 10, in the lid portion peeling step.

FIG. 15 is a cross-sectional view of the plane passing through the cap 10, in the lid portion peeling step. The lid portion peeling step peels the adhesive sheet 7 together with the lid portion 12, the shield layer 5, and the remaining portion 4R of the sealing resin.

According to the above steps, the electronic component module is manufactured. Although the present exemplary embodiment also shows an electronic component module as a single unit in each drawing shown above, a plurality of electronic component modules may be manufactured on a mother board, and lastly may be divided into an individual piece of a unit of an electronic component module.

According to the present exemplary embodiment, the following functional and advantageous effects in addition to the functional and advantageous effects described in the first exemplary embodiment are obtained.

In the grinding step, the remaining portion 4R of the sealing resin is left attached to the lid portion 12 when the sealing resin 4 and the cap 10 are ground, that is, the lid portion 12 remains, so that grinding dust does not easily enter the cap 10, and malfunction of the exposed component 20 due to the grinding dust is able to be reduced.

Fourth Exemplary Embodiment

In a fourth exemplary embodiment, an electronic component module different in the structure of the beam portion from the example shown in the first exemplary embodiment will be described.

Figure 16A:
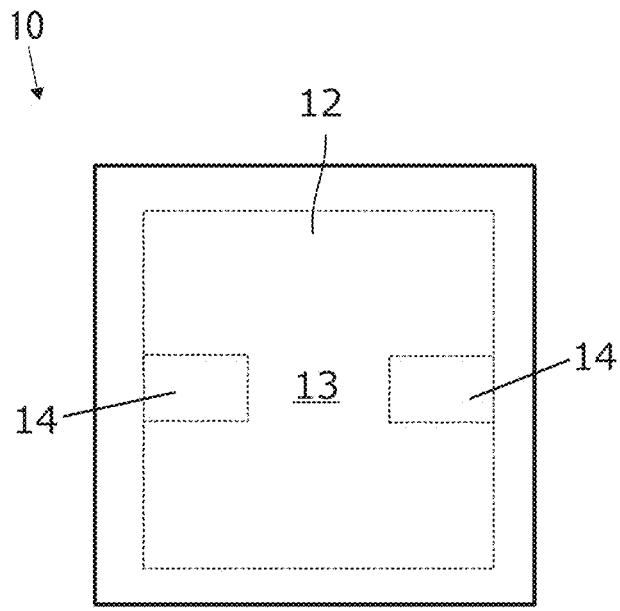
FIG. 16A and FIG. 16B are plan views of a cap 10 included in an electronic component module according to a fourth exemplary embodiment.
Figure 16B:
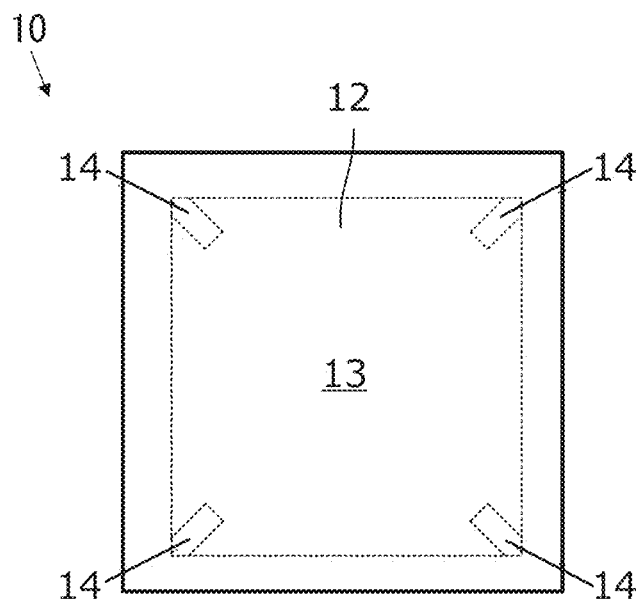
Figure 17A:
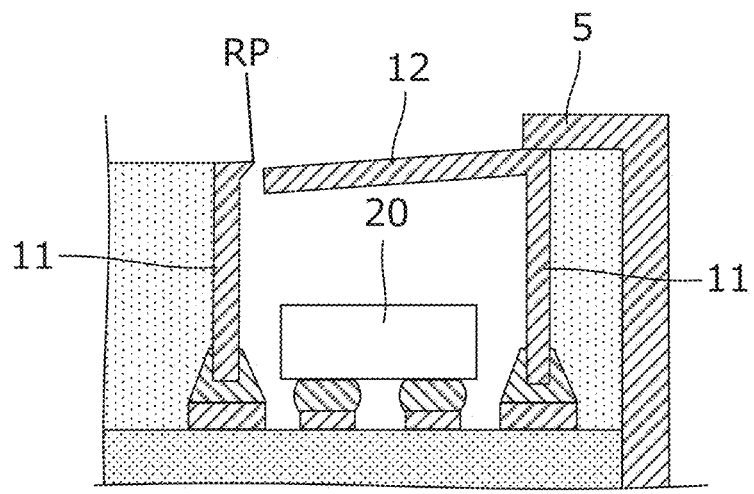
FIG. 17A is a cross-sectional view when a pressure during grinding is applied to the lid portion 12 of the cap, in a step of manufacturing a conventional electronic component module.
Figure 17B:
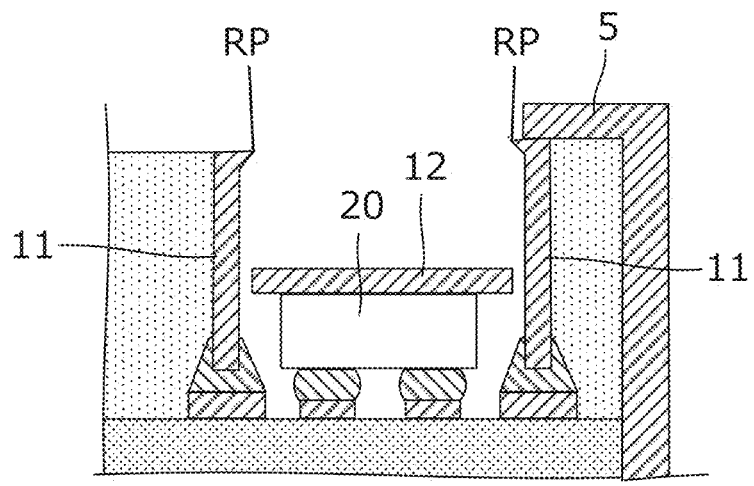
FIG. 17B is a cross-sectional view in a state in which the lid portion 12 of the cap is separated and enters the cap.

FIG. 16A and FIG. 16B are plan views of a cap 10 included in an electronic component module according to the fourth exemplary embodiment. In comparison with FIG. 9A and FIG. 9B shown in the second exemplary embodiment, a difference from the electronic component module according to the second exemplary embodiment is obvious.

In the example of FIG. 16A, the beam portion 14 is formed in two parts around the lid portion 12, and the regions except for the beam portion 14 are formed as the thin portion 13. In short, the thin portion 13 extends in a planar manner over a wide area of the lid portion 12. The beam portion 14 is formed in a central portion of facing two sides among four sides that the thin portion 13 forms.

In the example of FIG. 16B, the beam portion 14 is formed in four parts around the lid portion 12, and the regions except for the beam portion 14 are formed as the thin portion 13. In short, the thin portion 13 extends in a planar manner over a wide area of the lid portion 12. The beam portion 14 is formed at four corners of four sides that the thin portion 13 forms.

In such a manner, also in a case in which the thin portion 13 that extends in a planar manner is formed in the lid portion 12 of the cap 10, the beam portion 14 that supports the lid portion 12 may include a plurality of beam portions. In that case, the plurality of beam portions 14 are preferably placed to the center of the lid portion 12 in a symmetrical position. This is because the lid portion 12 is able to be stably supported on both ends.

It is to be noted that, even in the case in which the thin portion 13 that extends in a planar manner is formed in the lid portion 12 of the cap 10, the shape of the lid portion 12 is not limited to a square or a rectangle and may be a circle, an oval, an ellipse, or the like.

CP—cut surface
PP—protruding portion
RP—burr
4—sealing resin
4R—remaining portion
5—shield layer
6—module substrate
7—adhesive sheet
10—cap
11—side wall portion
12—lip portion
13—thin portion
14—beam portion
20—exposed component
21A—sealing component
21A to 21F—sealing component
61—base material layer
62—ground electrode layer
63—antenna conductor pattern
101—electronic component module

The invention claimed is:

1. A method of manufacturing an electronic component module, comprising:
    forming a cap including a side wall portion, a lid portion, a thin portion formed at least around the lid portion, and a beam portion supporting the lid portion;
    mounting an exposed component and an unexposed component on a module substrate;
    mounting the cap on the module substrate so as to surround the exposed component;
    grinding the lid portion so as to reduce a thickness of the lid portion of the cap until the thin portion disappears;
    attaching a translucent adhesive sheet on a top surface of the lid portion;
    cutting the beam portion through the adhesive sheet; and
    peeling the adhesive sheet together with the lid portion.

2. The method of manufacturing an electronic component module according to claim 1, further comprising sealing the unexposed component and the cap on the module substrate with a sealing resin, after mounting the cap.

3. The method of manufacturing an electronic component module according to claim 2, wherein:
    in forming the cap, the thin portion is formed on an entirety of the lid portion, except for the beam portion;
    in sealing the unexposed component and the cap, the lid portion is deformed so as to be depressed inside by a pressure when the sealing resin is sealed; and
    in grinding the lid portion, an outer peripheral portion of the lid portion, except for the beam portion, is caused to disappear.

4. The method of manufacturing an electronic component module according to claim 2, further comprising forming a shield layer on an outer surface of the sealing resin and a side surface of the module substrate, after grinding the lid portion.

5. An electronic component module comprising:
a module substrate including a ground electrode layer;
an exposed component and a sealing component, the exposed component and the sealing component being mounted on at least one surface of the module substrate;
a sealing resin covering the at least one surface of the module substrate and the sealing component;
a shield layer provided on a top surface and a side surface of the sealing resin and a side surface of the module substrate, and electrically connected to the ground electrode layer; and
a side wall portion surrounding a periphery of the exposed component and having conductivity to be electrically connected to the shield layer, wherein:
the side wall portion includes at least one protruding portion at an upper end portion of the side wall portion, the at least one protruding portion protruding toward an interior space surrounded by the side wall portion, and including a tip forming a polygon having a predetermined area; and
the shield layer is provided so as to cover an outer surface of the protruding portion.

6. The electronic component module according to claim 5, wherein:
the module substrate includes a conductor pattern of an antenna; and
the sealing component is a high-frequency circuit component to be connected to the conductor pattern of the antenna.

7. The method of manufacturing an electronic component module according to claim 3, further comprising forming a shield layer on an outer surface of the sealing resin and a side surface of the module substrate, after grinding the lid portion.

* * * * *